US012573469B2

(12) United States Patent
Goda et al.

(10) Patent No.: US 12,573,469 B2
(45) Date of Patent: Mar. 10, 2026

(54) READ PASS VOLTAGE ADJUSTMENT AMONG MULTIPLE ERASE BLOCKS COUPLED TO A SAME STRING

(71) Applicant: Micron Technology, Inc., Boise, ID (US)

(72) Inventors: Akira Goda, Setagaya (JP); Kishore K. Muchherla, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 18/622,190

(22) Filed: Mar. 29, 2024

(65) Prior Publication Data

US 2024/0347126 A1     Oct. 17, 2024

Related U.S. Application Data

(60) Provisional application No. 63/458,557, filed on Apr. 11, 2023.

(51) Int. Cl.
*G11C 29/50* (2006.01)
*G11C 16/26* (2006.01)
(52) U.S. Cl.
CPC ........ *G11C 29/50004* (2013.01); *G11C 16/26* (2013.01); *G11C 2029/5004* (2013.01)
(58) Field of Classification Search
CPC ...... G11C 29/50004; G11C 2029/5004; G11C 16/23
See application file for complete search history.

(56) References Cited

U.S. PATENT DOCUMENTS

| | | | |
|---|---|---|---|
| 7,177,977 B2 | 2/2007 | Chen | |
| 8,542,530 B2 | 9/2013 | Hemink | |
| 9,502,126 B1 * | 11/2016 | Kim | G11C 16/26 |
| 9,786,375 B2 | 10/2017 | Goda | |
| 10,229,740 B2 | 3/2019 | Cai | |
| 10,770,165 B1 * | 9/2020 | Cai | G11C 16/0483 |
| 2002/0039311 A1 * | 4/2002 | Takeuchi | G11C 16/20 365/185.09 |

(Continued)

OTHER PUBLICATIONS

H. Yoo et al., "New Read Scheme of Variable Vpass-Read for Dual Control Gate with Surrounding Floating Gate (DC-SF) NAND Flash Cell," 2011 3rd IEEE International Memory Workshop (IMW), Monterey, CA, USA, 2011.*

*Primary Examiner* — Steve N Nguyen
(74) *Attorney, Agent, or Firm* — Brooks, Cameron & Huebsch, PLLC

(57) ABSTRACT

An apparatus can comprise a memory array comprising multiple erase blocks coupled to a same plurality of strings of memory cells. A controller is configured to: apply a first read pass voltage to unselected access lines of the first group of access lines in association with performing a sensing operation on a selected access line of the first group of access lines; and determine a second read pass voltage to be applied to the second group of access lines in association with performing the sensing operation on the selected access line of the first group. The second read pass voltage is determined by: determining an amount of time that the second group of memory cells has been in a programmed state; or performing a scan to determine a threshold voltage (Vt) characteristic corresponding to the second group of memory cells; or both.

20 Claims, 9 Drawing Sheets

| | | PROGRAM TOP DECK | READ/PROGRAM VERIFY TOP DECK |
|---|---|---|---|
| 320 | BL | 0V | 0.5V |
| 326 | SGD | 3V | 5V |
| | UNSELECTED WL (TOP) | Vpass (10V) | Vpassr (8V) |
| | . . . | . . . | . . . |
| | UNSELECTED WLn-1 (TOP) | Vpass (10V) | Vpassr↑ (8.5V) |
| 305-1 | SELECTED WLn (TOP) | Vpgm (20V) | Vread (0V-7V) |
| | UNSELECTED WLn+1 (TOP) | Vpass (10V) | Vpassr↑ (8.5V) |
| | . . . | . . . | . . . |
| | UNSELECTED WL (TOP) | Vpass (10V) | Vpassr (8V) |
| | DUMMY WL(s) | Vpass (10V) | Vpassr_v |
| | UNSELECTED WL (BOTTOM) | Vpass (10V) | Vpassr_v |
| 305-2 | . . . | . . . | . . . |
| | UNSELECTED WL (BOTTOM) | Vpass (10V) | Vpassr_v |
| 327 | SGS | 0V | 5V |
| 329 | SL | 2V | 0V |

371      373

(56) References Cited

U.S. PATENT DOCUMENTS

| 2007/0206426 | A1* | 9/2007 | Mokhlesi | G11C 16/0483 |
| | | | | 257/E27.103 |
| 2007/0236990 | A1* | 10/2007 | Aritome | G11C 11/5628 |
| | | | | 257/E27.103 |
| 2007/0297226 | A1* | 12/2007 | Mokhlesi | G11C 16/3404 |
| | | | | 365/185.24 |
| 2012/0120727 | A1* | 5/2012 | Kim | G11C 11/5642 |
| | | | | 365/185.17 |
| 2012/0163096 | A1* | 6/2012 | Futatsuyama | G11C 16/0483 |
| | | | | 365/185.2 |
| 2012/0314499 | A1* | 12/2012 | Yuan | G11C 16/349 |
| | | | | 365/185.11 |
| 2015/0301885 | A1* | 10/2015 | Yuan | G11C 16/10 |
| | | | | 714/807 |
| 2017/0092368 | A1* | 3/2017 | Suito | G11C 16/345 |
| 2018/0012667 | A1* | 1/2018 | Costa | G11C 16/0483 |
| 2019/0043588 | A1* | 2/2019 | Fisher | G11C 16/26 |
| 2019/0214091 | A1* | 7/2019 | Lee | G11C 16/30 |
| 2020/0105351 | A1* | 4/2020 | Park | G06F 3/065 |
| 2020/0402587 | A1* | 12/2020 | Chibvongodze | G11C 11/5635 |
| 2021/0280251 | A1* | 9/2021 | Lee | G11C 16/0483 |
| 2023/0148136 | A1* | 5/2023 | Liu | G11C 29/50004 |
| | | | | 365/201 |
| 2024/0079063 | A1* | 3/2024 | Chen | G11C 11/5628 |

* cited by examiner

|  | 371 PROGRAM TOP DECK | 373 READ/PROGRAM VERIFY TOP DECK |
|---|---|---|
| BL | 0V | 0.5V |
| SGD | 3V | 5V |
| UNSELECTED WL (TOP) | Vpass (10V) | Vpassr (8V) |
| . . . | . . . | . . . |
| UNSELECTED WLn-1 (TOP) | Vpass (10V) | Vpassr1 (8.5V) |
| SELECTED WLn (TOP) | Vpgm (20V) | Vread (0V-7V) |
| UNSELECTED WLn+1 (TOP) | Vpass (10V) | Vpassr1 (8.5V) |
| . . . | . . . | . . . |
| UNSELECTED WL (TOP) | Vpass (10V) | Vpassr (8V) |
| DUMMY WL(s) | Vpass (10V) | Vpassr_v |
| UNSELECTED WL (BOTTOM) | Vpass (10V) | Vpassr_v |
| . . . | . . . | . . . |
| UNSELECTED WL (BOTTOM) | Vpass (10V) | Vpassr_v |
| SGS | 0V | 5V |
| SL | 2V | 0V |

320 — BL
326 — SGD
305-1 (UNSELECTED WL (TOP) through UNSELECTED WL (TOP))
305-2 (UNSELECTED WL (BOTTOM) through UNSELECTED WL (BOTTOM))
327 — SGS
329 — SL

READ OR PROGRAM VERIFY
COMMAND ISSUED
TO AGGRESSOR DECK ⎯661

662⎯ TIME
SINCE VICTIM DECK
PROGRAMMED
?

664

DETERMINE VICTIM
DECK READ PASS
VOLTAGE BASED ON TIME
SINCE VICTIM DECK
PROGRAMMED

READ PASS VOLTAGE ADJUSTMENT AMONG MULTIPLE ERASE BLOCKS COUPLED TO A SAME STRING

PRIORITY INFORMATION

This application claims the benefits of U.S. Provisional Application No. 63/458,557, file on Apr. 11, 2023, the contents of which are incorporated herein by reference.

TECHNICAL FIELD

Embodiments of the disclosure relate generally to memory systems, and more specifically, relate to apparatuses and methods for read pass voltage adjustment among multiple erase blocks coupled to a same string.

BACKGROUND

A memory system can include a memory sub-system, which can be a storage device, a memory module, or a hybrid of a storage device and a memory module. Examples of a storage device include a solid-state drive (SSD), a Universal Flash Storage (UFS) drive, a secure digital (SD) card, an embedded Multiple Media Card (eMMC), and a hard disk drive (HDD). Examples of memory modules include a dual in-line memory module (DIMM) and various types of non-volatile dual in-line memory modules (NVDIMMs). Memory systems include one or more memory components (e.g., memory devices) that store data. The memory components can be, for example, non-volatile memory components (e.g., NAND flash memory devices) and volatile memory components (e.g., DRAM devices). In general, a host system can utilize a memory system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 3B is a table illustrating bias voltages associated with performing operations on a memory array having multiple erase blocks per string in accordance with various embodiments of the present disclosure.

DETAILED DESCRIPTION

Figure 1:
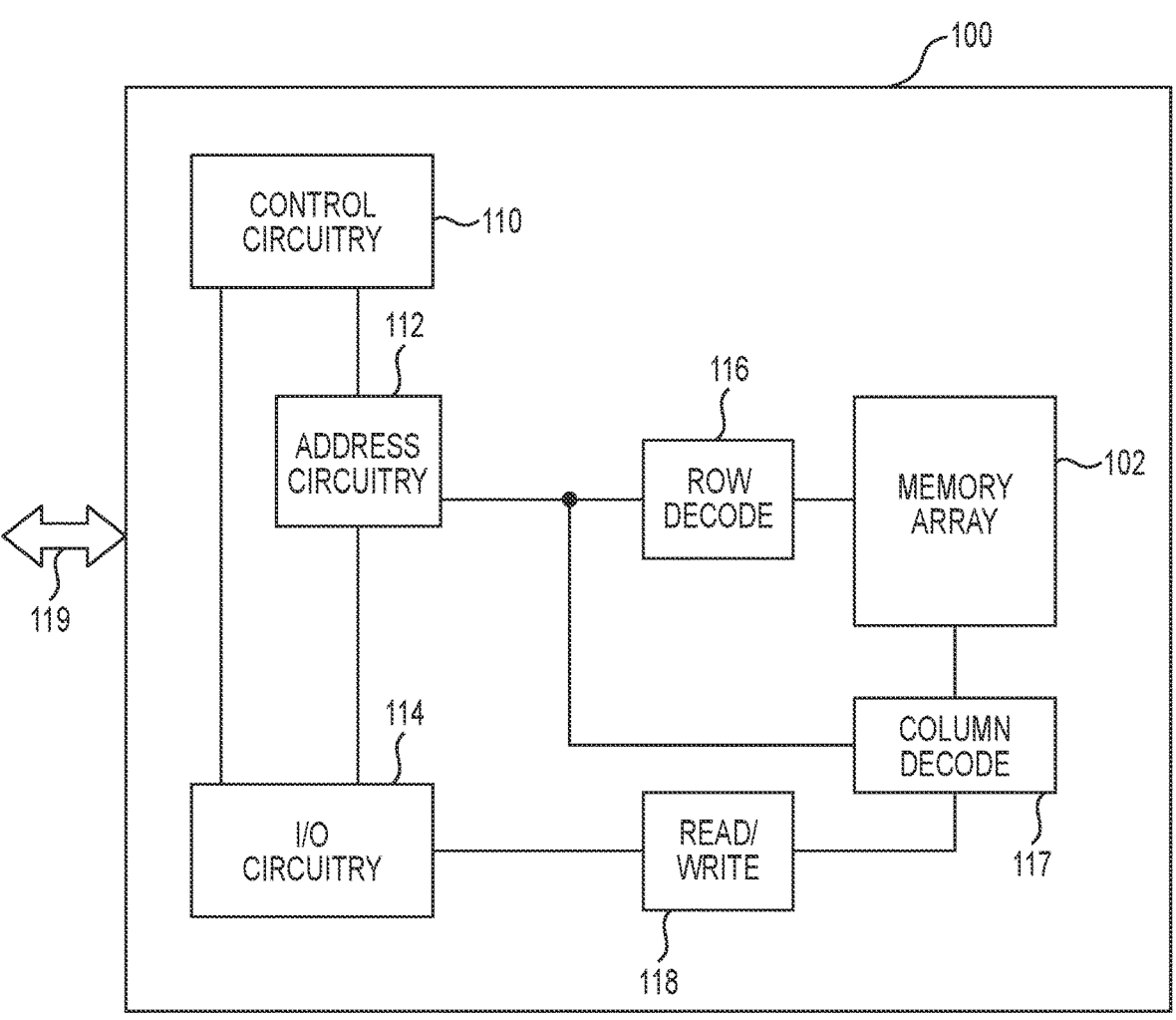
FIG. 1 illustrates an example portion of a memory system including a memory device having and array in accordance with various embodiments of the present disclosure.

Aspects of the present disclosure are directed to apparatuses and methods for read pass voltage adjustment among multiple erase blocks coupled to a same string. Various types of memory, such as NAND flash memory, include a memory array of many memory cells that can be arranged in row and column fashion and grouped in physical blocks. The cells can include a charge storage node such as a floating gate or charge-trap layer which allows the cells to be programmed to store one more bits by adjusting the charge stored on the storage node. Generally, an erase operation (e.g., a "block erase") is performed to erase all of the cells of a block together as a group.

Three-dimensional (3D) flash memory (e.g., a 3D NAND memory array) can include multiple strings of memory cells with each string comprising multiple series-coupled (e.g., source to drain) memory cells in a vertical direction, with the memory cells of a string sharing a common channel region. Each memory cell of a string can correspond to a different tier of the memory array, with a group of strings sharing multiple access lines, which may be referred to as word lines (WLs). Each access line can be coupled to respective memory cells of each string in the group of strings (e.g., the memory cells of a particular tier of the memory array). Groups of strings are coupled to respective sense lines, which may be referred to as data lines or bit lines (BLs), of a group of sense lines. The cells of the strings can be positioned between a drain-side select gate (referred to as a select gate drain (SGD)) and a source-side select gate (referred to as select gate source (SGS)) used to control access to the strings. A 3D NAND array can be a replacement gate (RG) NAND array or a floating gate NAND array, for example.

A 3D memory array can comprise multiple physical blocks each comprising a plurality of memory pages (e.g., physical pages of cells than can store one or more logical pages of data). In various previous approaches, a block of memory cells corresponds to a smallest group of memory cells that can be erased. For example, in prior approaches it is not possible to erase some of the memory cells of a block while maintaining data in other memory cells of the block.

Some prior approaches that may provide an ability to erase some memory cells of a block while maintaining data in other memory cells of the block can suffer various drawbacks. For example, if a first group of cells within a block share a string with a second group of cells within the same block, sensing operations (e.g., read operations and program verify operations) performed on the first group of cells can lead to disturb of the second group of cells. Such disturb results in threshold voltage (Vt) shifts of the second group of memory cells, which can result in increased bit error rates (BERs) and/or loss of data. The disturb, which can be referred to as "sensing disturb" or "read disturb"

herein, can accumulate (e.g., increase) over time on the second group of cells (e.g., the "victim" group) as the first group of cells (e.g., the "aggressor" group) experiences repeated program/erase (PE) cycling. The accumulated disturb can be evidenced by lower Vts of the victim group. Additionally, the amount of disturb on the victim group is a function of the read pass voltage applied to the corresponding victim word lines. For example, the amount of read disturb on the victim group is higher for increased read pass voltages and lower for decreased read pass voltages. As such, maintaining a static read pass voltage can lead to undesirable increased disturb as the Vts of the victim group shift (e.g., to lower voltages) over time.

Various embodiments of the present disclosure address the above and other deficiencies by providing apparatuses and methods that can determine appropriate read pass voltage adjustment among multiple erase blocks coupled to a same string in order to mitigate read disturb on erase blocks (e.g., victim erase blocks) over time. As used herein, an "erase block" refers to a group of cells that are configured to be erased together as a group and that share a same string as one or more additional groups of cells (e.g., one or more additional erase blocks). An erase block may also be referred to as a "deck." As such, a physical block of cells can include multiple decks. Decks experiencing read disturb due to operations (e.g., read operations, program verify operations) performed on one or more other decks sharing a string are referred to as "victim" decks, with the one or more other decks being referred to as "aggressor" decks.

As described further herein, various embodiments can include monitoring a time-after-programming (TAP) corresponding to a victim deck such that a variable (e.g., adjusted) read pass voltage can be opportunistically applied to the access lines of the victim deck during read and/or program verify operations performed on one or more aggressor deck. For example, as the TAP corresponding to the victim deck increases, a lower (in magnitude) read pass voltage can be applied to the access lines of the victim deck during aggressor deck read and program verify operations. In various embodiments, the TAP can be determined based on the power-on time of a memory system. In other embodiments, the TAP can be determined based on the time elapsed since the victim deck was programmed. Various embodiments can mitigate read disturb on a victim deck by managing different read pass voltages on victim decks and aggressor decks.

In various embodiments, a scan of a victim deck can be performed to determine a Vt characteristic associated with the victim deck. The Vt characteristic can be a Vt tail, for example, which can refer to an uppermost Vt value corresponding to a group of programmed cells. More specifically, the Vt tail can refer to the uppermost Vt value of the uppermost Vt distribution of a number of Vt distributions corresponding to respective program states (e.g., the uppermost Vt value of Vt distribution 575-4 shown in FIGS. 5A and 5B), and the scan can involve performing a number of read operations to determine a value of the Vt tail. The Vt tail can indicate a shift (e.g., downward) of the programmed Vt values, which can be used to determine an adjusted (e.g., reduced) read pass voltage that can be applied to victim access lines during read and/or program verify operations performed on aggressor decks. In various embodiments, the Vt characteristic can be a Vt valley and a scan of a victim deck can be performed to determine a Vt valley associated with the victim deck. A Vt valley can refer to a Vt value between adjacent Vt distributions corresponding to respective program states. Measured shifts in the Vt valley value can be used to determine victim read pass voltage adjustments (e.g., a downward shift in the Vt valley value can correlate to a particular downward shift in the victim read pass voltage value). In some embodiments, the location of the Vt tail or Vt valley can be tracked in real time as part of a read or program verify operation (e.g., as the word line voltage is ramped up).

FIG. 1 illustrates an example portion of a memory system including a memory device 100 having and array 102 in accordance with various embodiments of the present disclosure. The memory array 102 can be a 3D NAND array such as described further in association with FIG. 2, for example. The array can comprise single level cells (SLCs) storing 1 bit per cell, multilevel cells (MLCs) storing 2 bits per cell, triple level cells (TLCs) storing three bits per cell, or quad level cells (QLCs) storing 4 bits per cell, for example. Embodiments are not limited to a particular type of memory cell. The memory device 100 can be part of a memory system such as memory system 890 described in FIG. 8.

The memory device 100 includes control circuitry 110, address circuitry 112, input/output (I/O) circuitry 114 used to communicate with an external device via an interface 119, which may be a bus used to transmit data, address, and control signals, among other signals between the memory device 100 and an external host device, which can include a controller, host processor, etc., that is capable of accessing the memory array 102. As an example, the memory device 100 can be within a system such as an SSD with the interface 119 coupling the memory device 100 to a system controller. The interface 119 can include a combined address, control, and data bus or separate busses depending on the particular physical interface and corresponding protocol. The interface 119 can be an Open NAND Flash Interface (ONFI) interface or a Non-Volatile Memory Express (NVMe) interface; however, embodiments are not limited to a particular type of interface or protocol.

The control circuitry 110 can decode signals (e.g., commands) received via interface 119 and executed to control operations performed on the memory array 102. The operations can include data programming operations, which may be referred to as write operations, data read operations, which may be referred to as sensing operations, data erase operations, etc. The control circuitry 110 can cause various groups of memory cells (e.g., pages, blocks, erase blocks, etc.) to be selected or deselected in association with performing memory operations on the array 102. The control circuitry 110 can comprise a state machine, a sequencer, and/or some other type of control circuitry, which may be implemented in the form of hardware, firmware, or software, or any combination thereof.

The I/O circuitry 114 is used for bi-directional communication of data between the memory array 102 and the external host via interface 119. The address circuitry 112, which can include a register, can latch address signals received thereto, and the address signals can be decoded by a row decoder 116 and a column decoder 117 to access the memory array 102. The memory device 100 includes read/write circuitry 118 used to read data from and write data to the memory array 102. As an example, the read/write circuitry can include various latch circuitry, drivers, sense amplifiers, buffers, etc. Data can be read from the memory array 102 by sensing voltage and/or current changes on bit lines of the memory array 102.

Figure 2:
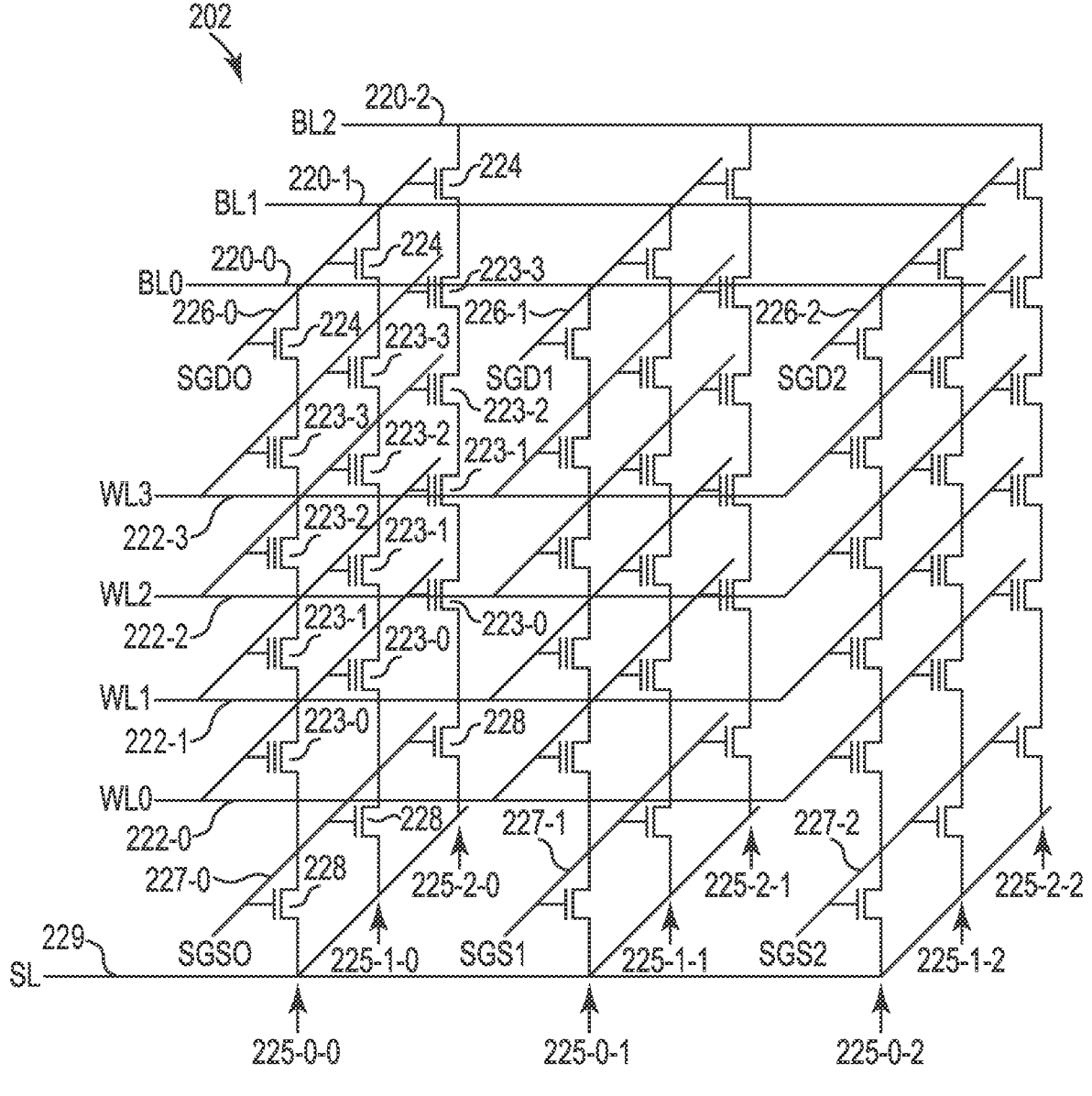
FIG. 2 is a schematic diagram illustrating an example memory array that can be operated in accordance with various embodiments of the present disclosure.

FIG. 2 is a schematic diagram illustrating an example memory array 202 in accordance with various embodiments of the present disclosure. The memory array 202 can be located in a memory device such as memory device 100 described in FIG. 1, for example. The memory array 200 is a 3D NAND array.

The memory array 200 comprises a number of access lines (word lines) 222-0 (WL0), 222-1 (WL1), 222-2 (WL2), and 222-3 (WL3) and a number of sense lines (bit lines) 220-0 (BL0), 220-1 (BL1), and 220-2 (BL2) coupled to multiple strings 225-0-0, 225-0-1, 225-0-2, 225-1-0, 225-1-1, 225-1-2, 225-2-0, 225-2-1, and 225-2-2. The word lines, bit lines, and strings are collectively referred to as word lines 222, bit lines 220, and strings 225, respectively. Although four word lines 222, three bit lines 220, and nine strings 225 are shown, embodiments are not so limited.

Each of the strings 225 comprises a number of memory cells (referred to collectively as memory cells 223) located between a select transistor 224 and a select transistor 228. For example, as shown in FIG. 2, strings 225-0-0, 225-1-0, and 225-1-2 each respectively comprise memory cells 223-0, 223-2, 223-2, and 223-3 located between select transistors 224 and 228 (e.g., respective drain-side select gate (SGD) 224 and source-side select gate (SGS) 228). The memory cells 223 can be floating gate transistors with the cells 223 of a given string 225 sharing a common channel region (e.g., pillar). As shown, the memory cells 223 of a given string are series-coupled source to drain between the SGD transistor 224 and the SGS.

The memory cells 223 of the strings 225 are stacked vertically such that they are located on distinct tiers/levels of the memory array 202. Each word line 222 can be commonly coupled to all the memory cells at a particular tier/level. For example, word line 222-0 can be coupled to (e.g., as the control gate) the nine memory cells 223-0 corresponding to the nine respective strings 225.

The select gate transistors 224 and 228 can be controlled (e.g., turned on/off) via the corresponding select gate signals SGD0, SGD1, SGD2, SGS0, SGS1, and SGS2 in order to couple the strings 225 to their respective bit lines 220 and a common source line (SL) 229 during memory operations (e.g., reads, writes, erases). As shown in FIG. 2, the select gate signals SGD0, SGD1, and SGD2 are provided (e.g., to the gates of transistors 224) via respective conductive lines 226-0, 226-1, and 226-2, and the select gate signals SGS0, SGS1, and SGS2 are provided (e.g., to the gates of transistors 228) via respective conductive lines 227-0, 227-1, and 227-2. Although the signals SGS0, SGS1, and SGS2 are shown on separate conductive lines 227, in some embodiments the conductive lines 227-0, 227-1, and 227-2 may be coupled via a common SGS line.

To perform memory operations on the array 202, particular voltages (e.g., bias voltages) can be applied to the word lines 222, bit lines 220, and source line 229. The particular voltages applied depends on the memory operation being performed, and different voltages may be applied to the word lines 222 during a particular memory operation in order to store data in a cell (or page of cells) or read data from a cell. Example biasing schemes are described in more detail in association with FIGS. 3A and 3B.

Figure 3A:
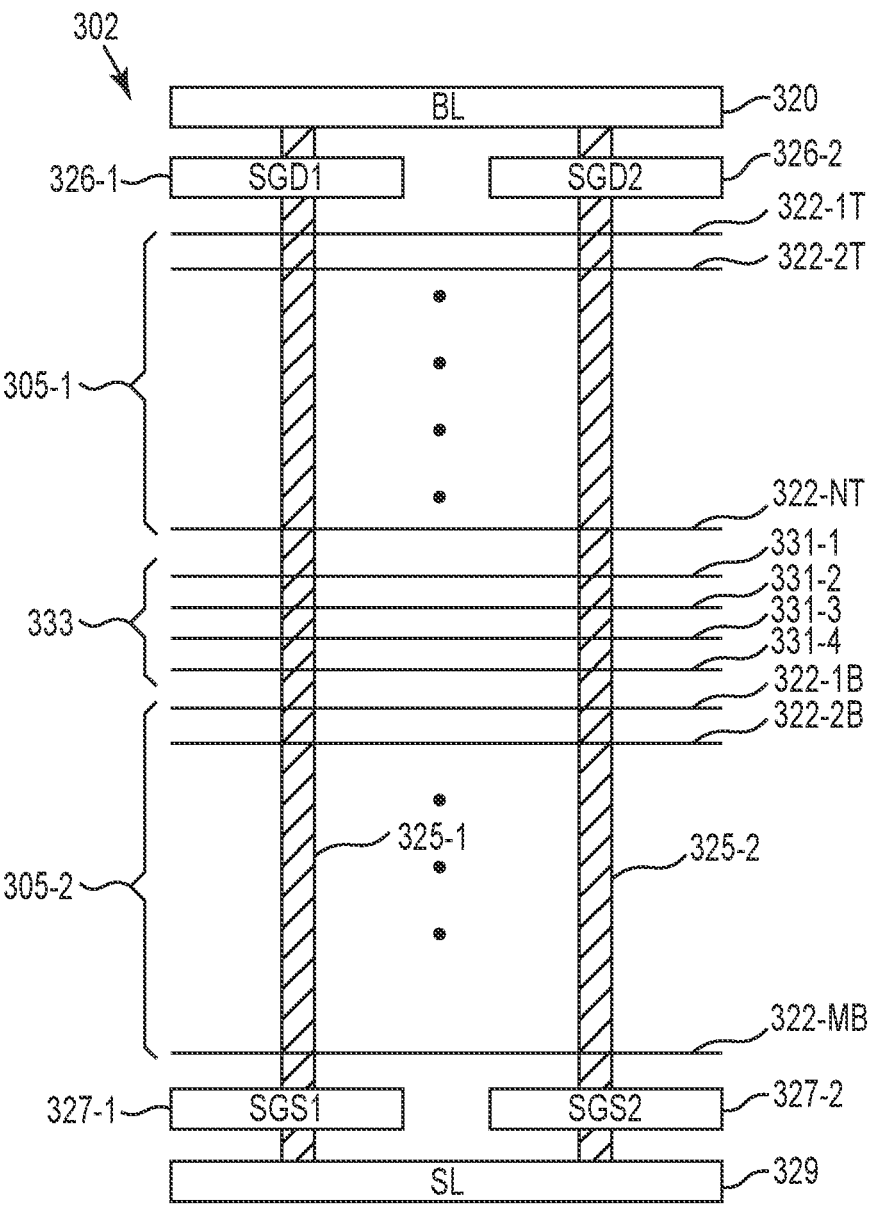
FIG. 3A schematically illustrates a portion of a memory array having multiple erase blocks per string and that can be operated in accordance with various embodiments of the present disclosure.

As described further in FIGS. 3A and 3B, the memory cells 223 of the array 202 can represent a physical block of memory cells that can comprise multiple (e.g., two or more) physical erase blocks. As an example, the word lines 222-0 and 222-1 can be coupled to cells of a first erase block, and the word lines 222-2 and 222-3 can be coupled to cells of a second/different erase block. Therefore, the cells 223-0 and 223-1 of the nine respective strings 225 (e.g., the cells of the first erase block) share respective common strings with the cells 223-2 and 223-3 (e.g., the cells of the second erase block).

As further described herein, an array (e.g., 202) can comprise a number of word lines physically between (e.g., separating) the word lines (e.g., 222) corresponding to different erase blocks. The word lines separating word lines corresponding to different erase blocks can be referred to as "dummy" word lines and can be coupled to dummy memory cells (e.g., within the strings 225) that are not used to store data. The dummy word lines and/or dummy cells can facilitate the ability to perform erase operations separately on erase blocks that share a common string or strings. The quantity of dummy word lines between erase blocks can vary, and various bias voltages can be applied to the dummy word lines during the various memory operations performed on the erase blocks.

In operation, erase blocks can be separately (e.g., individually) selected or deselected. For example, an erase operation can be performed on a selected first erase block corresponding to a group of strings while other erase block(s) corresponding to the same group of strings is deselected (e.g., such that is not erased). As described further herein, erase blocks that have been programmed can experience disturb (e.g., Vt voltage shifts of the constituent cells) when a neighbor erase block (e.g., a different erase block corresponding to the same strings) is programmed, read, and/or erased. As one example, a victim erase block (e.g., victim deck) can experience read disturb due to read operations performed on the victim erase block itself, as well as due to read operations and program verify operations performed on aggressor erase blocks coupled to the same string.

FIG. 3A schematically illustrates a portion of a memory array 302 having multiple erase blocks per string that can be operated in accordance with various embodiments of the present disclosure. FIG. 3B is a table illustrating bias voltages associated with performing operations on a memory array having multiple erase blocks per string in accordance with various embodiments of the present disclosure, such as the array 302 shown in FIG. 3A. The example shown can be a portion of the array 202 described in FIG. 2. The array portion 302 can be a portion of a physical block of memory cells that includes multiple erase blocks (e.g., decks).

In this example, the array 302 includes a plurality/group of word lines 322-1T, 322-2T, . . . , 322-NT corresponding to a first erase block 305-1 (e.g., a top deck) and a plurality/group of word lines 322-1B, 322-2B, . . . , 322-MB corresponding to a second erase block 305-2 (e.g., bottom deck). The designators "N" and "M" can represent various numbers (e.g., 3 or more) and "N" and "M" can be the same number. Accordingly, embodiments are not limited to a particular quantity of word lines 322 for the top deck 305-1 or bottom deck 305-2 (the designator "T" corresponding to "top" and the designator "B" corresponding to "bottom"). The array 302 also includes a number of dummy word lines 331-1, 331-2, 331-3, and 331-4, which can be collectively referred to as word lines 331. The dummy word lines 331 correspond to a separation region 333 between the top deck 305-1 and bottom deck 305-2. Although four word lines 331 are illustrated, embodiments can include more or fewer than four dummy word lines 331 separating erase blocks corresponding to same strings.

The array portion 302 illustrates two strings 325-1 and 325-2 for ease of illustration; however, embodiments can include many more strings 325. Memory cells are located at the intersections of the word lines 322/331 and strings 325, with the memory cells of a particular string 325 sharing a common channel region (e.g., pillar) as described in FIG. 2. The dummy word lines 331 can be coupled to dummy memory cells (e.g., cells that are not addressable to store user data).

As illustrated in FIG. 3A, a first end of the strings 325-1 and 325-2 can be coupled to a common source line 329 via respective select gate source lines 327-1 (SGS1) and 327-2 (SGS2). The second/opposite end of the strings 325-1 and 325-2 can be coupled to a bit line 320 via respective select gate drain lines 326-1 (SGD1) and 326-2 (SGD2). As such, the strings 325 (e.g., the cells thereof) can be individually accessed using the bit line 320 and select gates to which the lines 326-1 and 326-2 are coupled. Although only a single bit line 320 is shown, embodiments can include multiple bit lines such as shown in FIG. 2, for example.

As noted herein, in various embodiments, the top deck 305-1 and the bottom deck 305-2 can be read, programmed, and/or erased via separate operations even though the cells of the decks 305-1/305-2 share the same strings 325-1/325-2. For example, each one of the decks 305-1 and 305-2 can be individually programmed and/or erased without programming or erasing the other of the decks 305-1 and 305-2.

As described further herein, a particular (e.g., victim) erase block can experience read disturb due to read operations performed on itself, as well as due to read operations and program operations performed on aggressor erase blocks (e.g., other erase blocks coupled to the same strings as the victim erase block). The read disturb to a victim erase block due to program operations performed on an aggressor erase block is due to the program verify operation(s) associated with the program operations. As described below, the biasing voltages associated with a program verify operation are similar to the biasing voltages associated with a read operation. As an example, a particular program operation can include multiple (e.g., 2, 4, 8, 15) program verify operations, with the quantity of program verify strobes depending on the quantity of program states and/or the quantity of programming pulses corresponding to the program operation.

As noted herein, the read disturb (e.g., Vt shifts) experienced by a victim deck is a function of the read pass voltage applied to the access lines of the victim deck, and the read disturb can accumulate over time due to reads performed on the victim deck, reads performed on aggressor decks, and program verify operations performed on the aggressor decks, which can accumulate over multiple program/erase (P/E) cycles on the aggressor decks. The physical separation between the word lines of the top and bottom decks provided by the dummy word lines 331 and/or the bias voltages provided thereto can reduce the Vt shifts experienced by a victim deck (e.g., 305-2); however, repeated reads of the victim deck, reads of an aggressor deck (e.g., 305-1), and program verifies on the aggressor deck (e.g., 305-1) can result in an accumulation of Vt shifts to cells of the victim deck (e.g., 305-2). Such Vt shifts can become particularly detrimental for decks that store relatively "cold" data that may not be refreshed often via a memory management operation such as a garbage collection operation in which valid data of a deck is moved to a different deck prior to erasing the deck. In such instances, an aggressor deck may experience hundreds or thousands of P/E cycles while the victim deck stores particular valid data.

As described further below, particularly in association with FIG. 3B, FIG. 5A-5B, and FIG. 6, various embodiments of the present disclosure can include applying a first read pass voltage to unselected access lines of a first group of access lines (e.g., aggressor word lines) in association with performing a sensing operation (e.g., read operation and/or program verify operation) on a selected access line of the first group of access lines, and determining a second read pass voltage to be applied to a second group of access lines (e.g., victim word lines) in association with performing the sensing operation on the selected access line of the first group of access lines. The value of the read pass voltage to be applied to the victim word lines can be determined, for example, by determining an amount of time that the memory cells of the victim word lines have been in a programmed state and/or by performing a scan to determine the Vt tail corresponding to the cells of the victim word lines; or both.

Column 371 of the table shown in FIG. 3B represents the biasing voltages applied to an array (e.g., 302) in association with performing a programming operation on a selected deck (e.g., top deck 305-1). Column 373 represents the biasing voltages applied to the array in association with performing a read operation or a program verify operation on a selected deck (e.g., 305-1). In this example, for purposes of read disturb tracking, the top deck 305-1 represents an aggressor deck and the bottom deck 305-2 (e.g., the unselected deck) represents a victim deck.

The example programming operation shown in FIG. 3B involves applying a programming voltage (Vpgm) to a selected word line (e.g., SELECTED WLn) within the selected deck (e.g., the top deck 305-1). The programming voltage can be applied to the selected word line as a plurality of pulses, for example, and is intended to increase the Vt of a selected cell by adding charge to its floating gate. As illustrated, the unselected word lines of the string (e.g., the remaining word lines of the top deck 305-1, the dummy word lines, and the word lines of the bottom deck 305-2) are biased with a program pass voltage (Vpass). The bit line 320 corresponding to the selected string is biased at 0V, the drain select gate 326 is biased at 3V, the source select gate 327 is biased at 0V, and the source line 329 is biased at 2V during the programming operation.

A programming operation involves performing program verify operations to determine when the Vt of the cells being programmed have reached a desired level. As such, a program verify operation essentially involves performing a read operation on the selected cells (e.g., the cells coupled to the selected word line). As shown in FIG. 3B, a read operation and/or a program verify operation can involve applying a read voltage (Vread) to the selected word line (SELECTED WLn), while applying a read pass voltage (Vpassr, Vpassr1, or Vpass_v) to the unselected word lines of the string (e.g., the remaining word lines of the top deck 305-1, the dummy word lines, and the word lines of the bottom deck 305-2). The read pass voltage is designed to place the unselected cells of a string in a conductive state in order to allow current to flow through the string depending on the applied read voltage (Vread) and Vt of the selected cell. In this manner, the read or program verify operation can be used to determine if the Vt of the selected cell is above or below a particular level (e.g., above or below Vread).

In this example, the bit line 320 corresponding to the selected string is biased at 0.5V, the drain select gate 326 is biased at 5V, the source select gate 327 is biased at 5V, and the source line 329 is biased at 0V during the read or program verify operation. For multistate memory cells, a read operation can include multiple strobes to distinguish between the multiple possible states of a cell, as described further in association with FIGS. 5A and 5B.

In a number of embodiments, and as shown in FIG. 3B, the unselected word lines (e.g., WLn+1 and WLn−1) adjacent to the selected word line (e.g., WLn) can be biased at a higher read pass voltage (e.g., Vpassr1) as compared to the other unselected word lines, which are biased at Vpassr. As an example, Vpassr1 can be 8.5V-9.5V and Vpassr can be 8V. The increased Vpassr1 voltage can counteract a "pull down" voltage on WLn+1 and WLn−1 that results from coupling between WLn+1/WLn−1 and WLn, depending on the bias (Vread) on WLn. Such pull down can result in cells coupled to WLn+1/WLn−1 not being fully conductive (e.g., turned on) during the read, which can result in read errors. However, the increased Vpassr1 (as compared to Vpassr) can result in increased read disturb stress on the cells coupled to WLn+1 and WLn−1 (e.g., for cells coupled to WLn+1/WLn−1 and that have relatively low Vts).

As described herein, read disturb on a victim deck (e.g., 305-2) can be aggravated due to repeated reads and program verifies on the aggressor deck (e.g., 305-1) since the victim deck 305-2 experiences read disturb due to the applied read pass voltage (Vpassr_v). Also, the read disturb on the victim deck 305-2 can occur over a relatively long duration such as over multiple aggressor deck P/E cycles. Over time, the Vt levels of the victim cells can shift downward. Accordingly, it can be beneficial to reduce the magnitude of the read pass voltage (Vpassr_v) applied to the victim access lines in order to reduce/mitigate the read disturb on the victim deck 305-2 due to reads and/or program verifies performed on the aggressor deck 305-1.

As such, in various embodiments, the read pass voltage Vpassr_v is a variable voltage that can be determined (e.g., adjusted) based on different factors. In various instances, the value of Vpassr_v can be based on the amount of time that has passed since the victim deck 305-2 was programmed. The value of Vpassr_v can also be based on the amount of time that has passed since the memory device or memory system comprising the memory array was powered on. For example, the value of Vpassr_v may initially be the same as Vpassr (e.g., 8V), but over time the value of Vpassr_v can be reduced (e.g., to 7.9V, 7.5V, 7V, etc.) to account for the downward shifting Vt levels of the victim cells. Therefore, the read pass voltages applied to the aggressor access lines and victim access lines can be different, and the difference can increase as the age of the victim deck (e.g., the amount of time since being programmed) further increases past the age of the aggressor deck).

In various embodiments, the downward shifting of victim cell Vt levels can be determined by performing scan operations (e.g., periodically) to determine the Vt tail of Vt distributions of the programmed victim cells. Determining the value of the Vt tail provides the ability to adjust the victim read pass voltage Vpassr_v to a reduced value as the Vt levels of the victim cells shift downward, which is described further in association with FIGS. 5A and 5B. In a number of embodiments, the victim read pass voltage Vpassr_v can be adjusted (e.g., reduced) based on a valley position, which refers to the Vt value between adjacent Vt distributions. For example, the downward shifting valley position can be determined (e.g., tracked) and the Vpassr_v value can be adjusted based thereon. The Vt tail and/or valley location can be measured during a scan operation that is separate from a read or program verify operation. Alternatively, the Vt tail and/or valley location can be measured in real time during a read or program verify operation. For example, a read operation can involve ramping the word line voltages of the selected word line (e.g., the word line to be read) and the unselected word lines to a read pass voltage, and then ramping down the voltage of the selected word line to the desired read (or program verify) voltage. In various embodiments, the Vt tail and/or valley associated with the victim cells (e.g., cells coupled to victim word lines) can be determined as the word line voltage is being ramped to a read pass voltage, and then the victim read pass voltages can ramped down from the read pass voltage to the adjusted (e.g., reduced) victim read pass voltage prior to the selected word line voltage being ramped down to the target read or program verify value.

Figure 4:
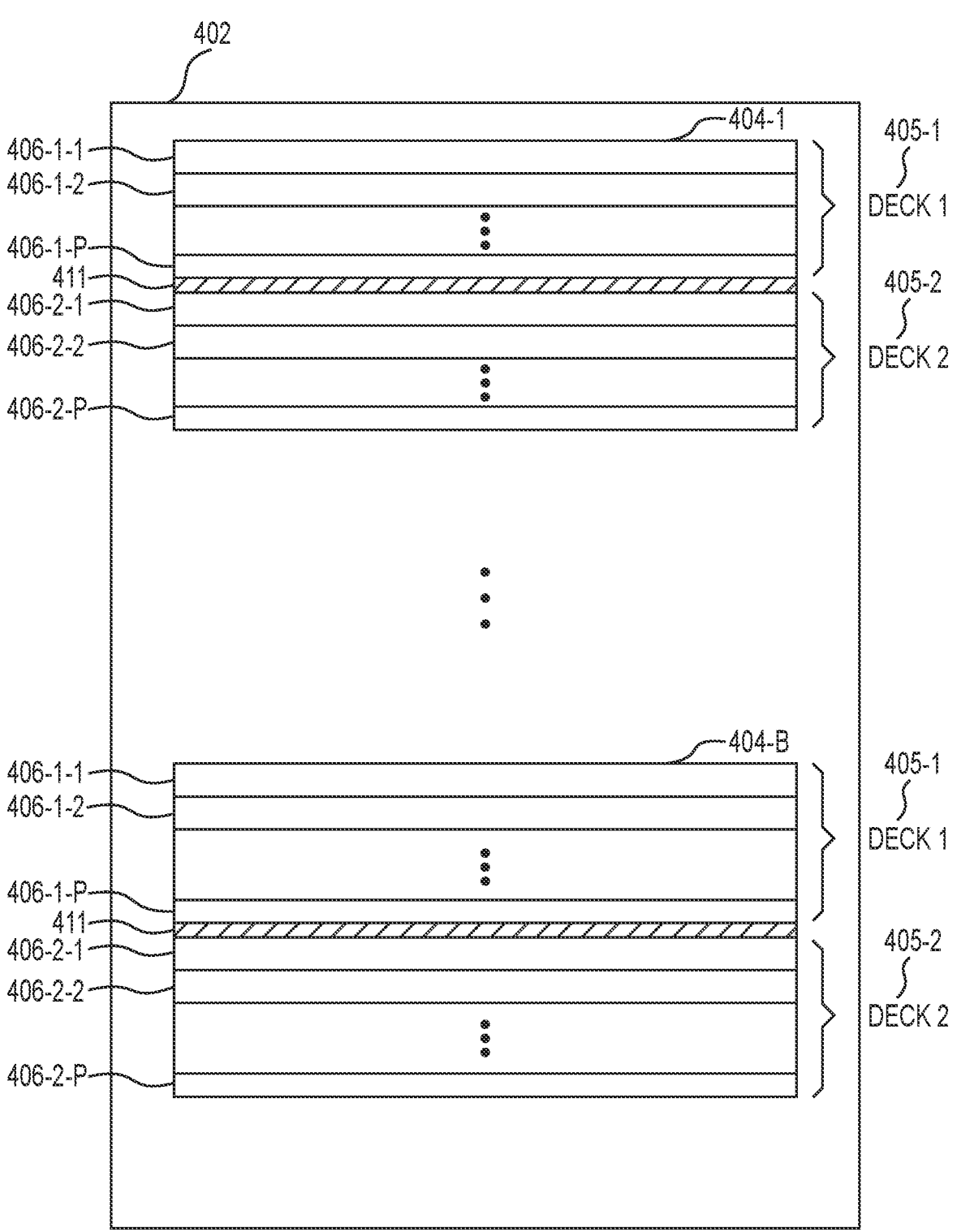
FIG. 4 illustrates a portion of a memory array having multiple erase blocks per string and that can be operated in accordance with various embodiments of the present disclosure.

FIG. 4 illustrates a portion of a memory array 402 having multiple erase blocks per string in accordance with various embodiments of the present disclosure. The memory array 402 includes multiple physical blocks 404-1, . . . , 404-B and can be operated in accordance with one or more embodiments of the present disclosure. The indicator "B" is used to indicate that the array 402 can include a number of physical blocks 404. As an example, the number of physical blocks in array 402 can be 128 blocks, 512 blocks, or 1,024 blocks, but embodiments are not limited to a particular multiple of 128 or to any particular number of physical blocks in an array 402. The memory array 402 can be, for example, a NAND flash memory array (e.g., a 3D NAND flash array such as array 102, 202, and/or 302).

Each of the physical blocks 404-1, . . . , 404-B includes a first erase block 405-1 (DECK_1) and a second erase block 405-2 (DECK_2) separated by a region 411, which can correspond to a region of dummy word lines such as word lines 331 shown in FIG. 3A. As described above, the decks 405-1 and 405-2 are commonly coupled to the strings of the blocks 404-1, . . . , 404-B with the decks 405-1 and 405-2 being separately erasable via a block erase operation (e.g., deck 405-1 can be erased without erasing deck 405-2 and vice versa). Although the physical blocks 404 are shown as including two decks, embodiments are not so limited. For example, the physical blocks 404 can include more than two decks and in some embodiments different physical blocks 404 can include different quantities of decks.

Each deck 405-1 and 405-2 can comprise a number of physical pages, which can correspond to a "row" of the array corresponding to a particular word line. As shown, deck 405-1 comprises pages 406-1-1, 406-1-2, . . . , 406-1-P, and deck 405-2 comprises pages 406-2-1, 406-2-2, . . . , 406-2-P. The designator "P" is used to indicate that the decks 405-1 and 405-2 can comprise a plurality of pages/rows. Each physical page (collectively referred to as pages 406) can store multiple logical pages of data. A page can refer to a unit of programming and/or reading (e.g., a group of cells that are programmed and/or read together as a functional group).

Figures 5A, 5B:
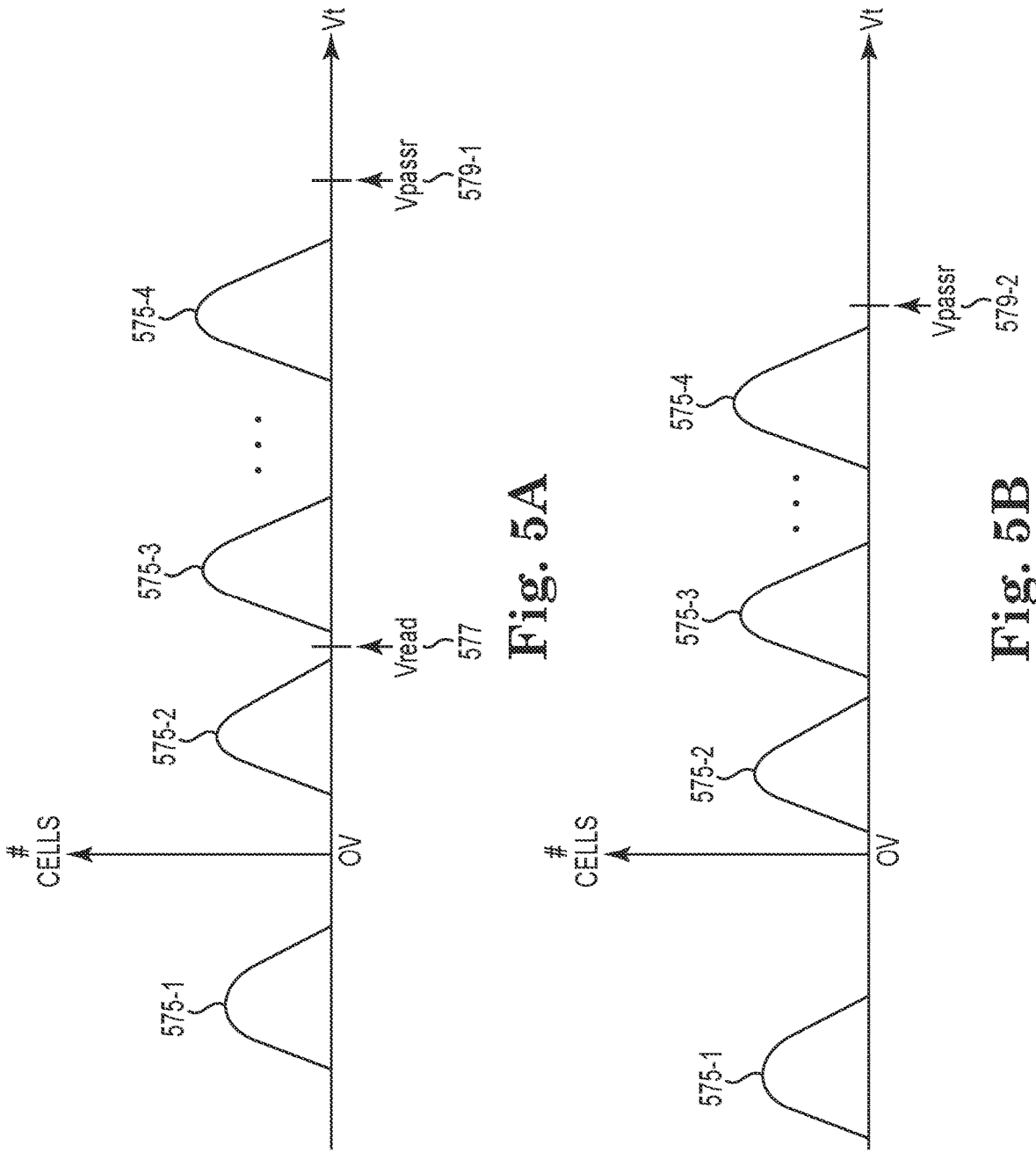
FIG. 5A illustrates example threshold voltage distributions associated with memory cells of an array having multiple erase blocks per string in accordance with various embodiments of the present disclosure.
FIG. 5B illustrates example threshold voltage distributions and an adjusted read pass voltage in accordance with various embodiments of the present disclosure.

FIG. 5A illustrates example threshold voltage distributions associated with memory cells of an array having multiple erase blocks per string in accordance with various embodiments of the present disclosure. FIG. 5B illustrates the example threshold voltage distributions of FIG. 5A subsequent to downward Vt shifting and an adjusted read pass voltage determined in accordance with various embodiments of the present disclosure.

The Vt distributions 575-1, 575-2, 575-3, and 575-4, which can be referred to collectively as Vt distributions 575, represent states to which memory cells can be programmed. As an example, the Vt distributions 575 can correspond to a group of programmed cells of a victim deck (e.g., victim erase block). FIG. 5A illustrates the Vt distributions 575 corresponding to the victim memory cells at a particular time after being programmed (e.g., initial Vt distributions), while FIG. 5B illustrates the Vt distributions 575 subsequent to an elapsed amount of time during which the Vts of the victim cells have shifted downward due to various factors such as repeated reads and program verifies performed on an aggressor deck, which can occur across multiple P/E cycles. Although four states (e.g., four Vt distributions 575) are shown, embodiments are not limited to a particular quantity of states or bits per cell. In various instances, the lowermost Vt distribution 575-1 is referred to as an erase state and is that state at which memory cells of an erase block are placed when erased. A programming operation can include increasing the Vt of a cell from the erase state 575-1 to one of the other states (e.g., 575-2, 575-3, 575-4).

FIG. 5A also illustrates an example read voltage 577 (Vread). As described in FIG. 3B, the read voltage 577 can be applied to a selected word line to determine whether the Vt of the selected cell is above or below Vread. If the Vt of the selected cell is below Vread, the cell will conduct and current through the string is sensed (e.g., on the bit line), and if the Vt of the selected cell is above Vread, the cell won't conduct and current won't be sensed. FIG. 5A illustrates a read pass voltage (Vpassr) 579-1 (e.g., a voltage higher than the uppermost Vt state 575-4) at which word lines coupled to the memory cells are biased such that the memory cells will conduct regardless of their programmed state.

As illustrated in FIG. 5B, the read pass voltage (Vpassr) 579-2 is adjusted downward as compared to the Vpassr 579-1 of FIG. 5A. Since read disturb experienced by the victim deck is a function of the magnitude of the read pass voltage, the reduced magnitude of the read pass voltage 579-2 as compared to 579-1 results in a reduced read disturb on the victim deck per read and program verify operation performed on an aggressor deck. As the Vt levels of the victim memory cells continue to decrease as the time-after-programming increases, further opportunity to reduce the read pass voltage can arise. As described above, the value of the adjusted Vpassr 579-2 can be determined based on a number of factors such as how much time has passed since the victim deck was programmed or how much time has passed since the memory device/system was powered on. In a number of embodiments, the value of the adjusted Vpassr 579-2 can also take into account other stress factors such as the P/E cycle count (e.g., wear) of the victim deck and/or the temperature stress of the victim deck. For instance, the temperature and/or P/E cycle counts of victim decks can be monitored (e.g., at various intervals) and a weighted average could be applied to determine the appropriate Vpassr 579-2 adjustment based on time, temperature, and/or wear of the victim deck. As an example, temperature can be monitored every "X" minutes and P/E cycles can be monitored as various threshold cycle counts are reached over time. Alternatively, a scan operation can be performed on the victim deck to determine the Vt tail of the distributions 575 (or a valley between distributions), which can correspond to an uppermost (e.g., rightmost) voltage of the uppermost Vt distribution 575-4. The scan can be performed periodically, and the value of 579-2 can be set at a voltage above the Vt tail value. The scan can be performed in real time (e.g., during a read or program verify operation) or independently/separately from read or program verify operations.

Figure 6:
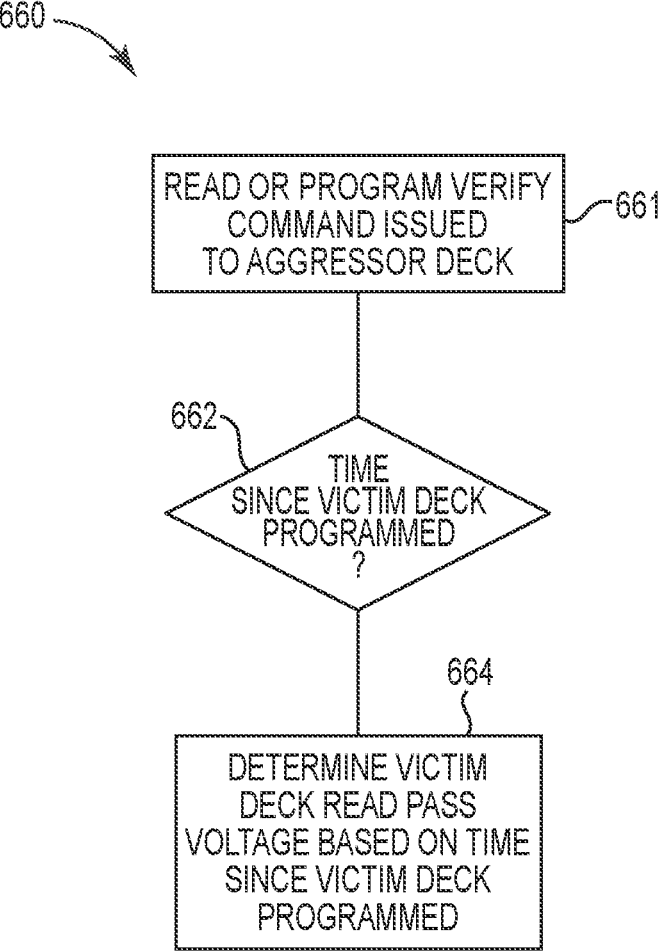
FIG. 6 is a flow diagram that illustrates an example method for read pass voltage adjustment among multiple erase blocks coupled to a same string in accordance with various embodiments of the present disclosure.

FIG. 6 is a flow diagram that illustrates an example method 660 for read pass voltage adjustment among multiple erase blocks coupled to a same string in accordance with various embodiments of the present disclosure. The method 660 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 660 is performed by the control circuitry 110 of FIG. 1 and/or the controller 891 of FIG. 8. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At step 661, a read or a program verify operation is performed on (e.g., issued to) an aggressor deck (e.g., from a command queue). At step 662, a time period since the victim deck was programmed is determined, and at step 664 a victim deck read pass voltage is determined based on the determined time since the victim deck was programmed.

The value of the victim read pass voltage (e.g., Vpassr_v shown in FIG. 3B, or Vpassr 579-2 shown in FIG. 5B) can be determined in various manners. As one example, different particular reduced victim read pass voltages can be used with their values being based on the TAP reaching respective threshold levels; however, embodiments are not so limited. As mentioned above, in addition to TAP, temperature and P/E cycles also cause stress on victim decks. Accordingly, some embodiments can involve maintaining multiple look-up tables indicating appropriate victim read pass voltages. For example, different tables can be maintained for respective different P/E cycle ranges with each table indicating victim read pass voltages for different TAP values. Temperature measurements can be used, for example, to add a weight factor on TAP values. As described herein, the victim read pass voltages (e.g., adjusted victim read pass voltage values) can also be determined based on scan operations to determine the location of the Vt tail or of a valley between Vt distributions and such scans can occur periodically and can occur between read operations or during read operations (e.g., in real time).

Figure 7:
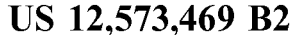
FIG. 7 illustrates a portion of a memory device having multiple erase blocks per string in accordance with various embodiments of the present disclosure.

FIG. 7 illustrates a portion of a memory device having multiple erase blocks per string in accordance with various embodiments of the present disclosure. In various embodiments, the physical blocks of a memory array can be organized into planes. For example, FIG. 7 illustrates memory arrays 702-0, 702-1, 702-2, and 702-3 each divided into a first plane (PLANE 0) of physical blocks and a second plane (PLANE 1) of physical blocks. Embodiments are not limited to a particular quantity of planes per array. Each array 702-0, 702-1, 702-2, and 702-3 corresponds to a respective logical unit (LUN) LUN0, LUN1, LUN2, and LUN3. Each LUN can correspond to a different memory device (e.g., memory device 100 shown in FIG. 1); however, embodiments are not so limited. For example, a memory device (e.g., die) can include multiple LUNs. A LUN can, for example, correspond to a smallest unit that can independently execute commands and report status.

The physical blocks of the planes can comprise multiple erase blocks sharing common strings as described herein. The physical blocks can be grouped into "super blocks" with each super block comprising a physical block from each plane (e.g., PLANE 0 and PLANE 1) across multiple LUNs (e.g., across multiple arrays 702). Similarly, embodiments of the present disclosure an include a number of super decks 715-1 (SUPER DECK_1), 715-2 (SUPER DECK_2), . . . , 715-D (SUPER DECK_D). Each super deck (or super erase block) 715 can comprise a deck from each plane across multiple LUNs. For example, a first super deck 715-1 (SUPER DECK_1) can comprise a deck from plane 0 of LUN0, a deck from plane 1 of LUN1, a deck from plane 0 of LUN1, a deck from plane 1 of LUN1, a deck from plane 0 of LUN2, a deck from plane 1 of LUN2, a deck from plane 0 of LUN3, and a deck from plane 1 of LUN3.

Embodiments of the present disclosure can monitor read disturb on a super deck level as well as, or instead of, on a deck level. For instance, consider an example in which the constituent decks of a super deck 715-1 share common strings with the respective constituent decks of a super deck 715-2 (e.g., super decks 715-1 and 715-2 are located in a same physical super block). The decks of super deck 715-1 can be erased together as a group and therefore can be considered an aggressor super deck since the read and program operations performed thereon can contribute to read disturb on each of the victim decks of the corresponding victim super deck 715-2. In various embodiments, a victim read disturb count based on victim reads, aggressor reads, and aggressor program verifies can be maintained on a deck level and/or on a super deck level.

Figure 8:
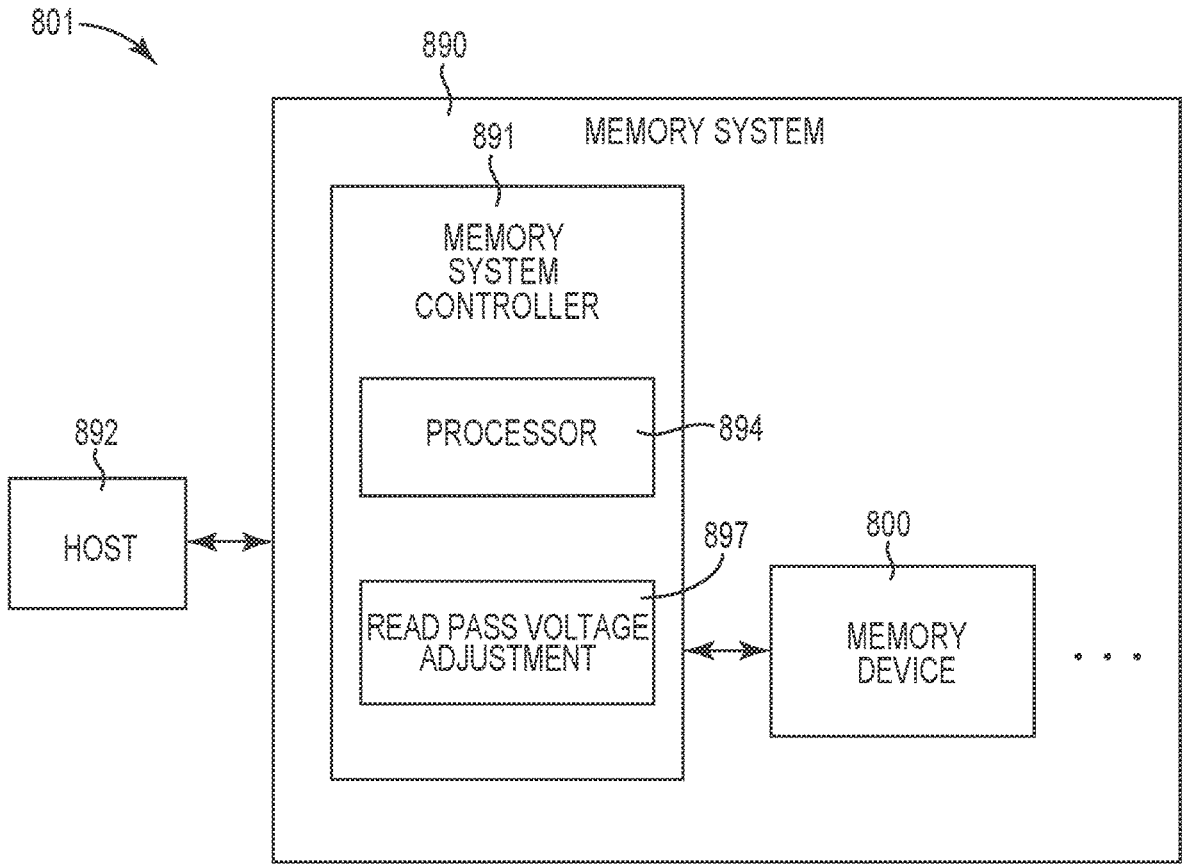
FIG. 8 illustrates an example computing system having a memory system for performing read pass voltage adjustment among multiple erase blocks coupled to a same string in accordance with various embodiments of the present disclosure.

FIG. 8 illustrates an example computing system 801 having a memory system 890 for performing read pass voltage adjustment among multiple erase blocks coupled to a same string in accordance with various embodiments of the present disclosure. As shown in FIG. 8, the memory system 890 includes a system controller 891 and a number of memory devices 800, which can be memory devices such as device 100 described in FIG. 1 (e.g., memory devices comprising memory arrays having multiple erase blocks coupled to common strings).

In some embodiments, the memory system 890 is a storage system. An example of a storage system is a solid-state drive (SSD). In some embodiments, the memory system 890 is a hybrid memory/storage sub-system. In general, the computing environment shown in FIG. 8 can include a host system 892 that uses the memory system 890. For example, the host system 892 can write data to the memory system 890 and read data from the memory system 890.

The memory system controller 891 (hereinafter referred to as "controller") can communicate with the memory devices 800 to perform operations such as reading data, writing data, or erasing data at the memory devices 800 and other such operations. The controller 891 can include hardware such as one or more integrated circuits and/or discrete components, a buffer memory, or a combination thereof. The controller 891 can include a microcontroller, special purpose logic circuitry (e.g., a field programmable gate array (FPGA), an application specific integrated circuit (ASIC), etc.), or other suitable processing circuitry. The controller 891 can include a processing device (e.g., processor 894) configured to execute instructions stored in local memory (not shown).

In this example, the controller 891 includes a read pass voltage adjustment component 897 that can be responsible for determining adjusted read pass voltages to be applied to victim decks during read and program verify operations performed on aggressor decks in accordance with various embodiments described herein. For example, the values of the adjusted read pass voltages can be based on the determined amount of time since the victim deck was programmed and/or since the memory system 890 was powered on, for example. Additionally, or alternatively, the values of the adjusted read pass voltages can be based on factors such as P/E cycles and/or temperature stress associated with the victim deck(s). In some embodiments, the values of the adjusted read pass voltages can be determined based on Vt characteristics such as a determined Vt tail location or Vt valley location associated with the victim deck(s).

In general, the controller 891 can receive commands or operations from the host system 892 and can convert the commands or operations into instructions or appropriate commands to achieve the desired access to the memory devices 800. The controller 891 can be responsible for other operations such as wear leveling operations, garbage collection operations, error detection and error-correcting code (ECC) operations, encryption operations, caching operations, and address translations between a logical block address and a physical block address that are associated with the memory devices 800.

The host system 892 can be a computing device such as a desktop computer, laptop computer, network server, mobile device, or other such computing device that includes a memory and a processing device. The host system 892 can include, or be coupled to, the memory system 890 so that the host system 892 can read data from or write data to the memory system 890. The host system 892 can be coupled to the memory system 890 via a physical host interface (not shown in FIG. 8). As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, a universal flash storage (UFS) interface, a universal serial bus (USB) interface, Fibre Channel, Serial Attached SCSI (SAS), etc. The physical host interface can be used to transmit data between the host system 892 and the memory system 890. The host system 892 can further utilize an NVM Express (NVMe) interface to access the memory devices 800 when the memory system 890 is coupled with the host system 892 by the PCIe interface. The physical host interface can provide an interface for passing control, address, data, and other signals between the memory system 890 and the host system 892.

While the example memory system 890 in FIG. 8 has been illustrated as including the controller 891, in another embodiment of the present disclosure, a memory system 890 may not include a controller 891, and can instead rely upon external control (e.g., provided by a processor or controller separate from the memory system 890, such as by host 892 communicating directly with the memory devices 800).

Although the memory system 890 is shown as physically separate from the host 892, in a number of embodiments the memory system 890 can be embedded within the host 892. Alternatively, the memory system 890 can be removable from the host 892.

As used herein, an "apparatus" can refer to various structural components. For example, the computing system 801 shown in FIG. 8 can be considered an apparatus. Alternatively, the host 892, the controller 891, and the memory device 800 might each separately be considered an apparatus.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. As will be appreciated, elements shown in the various embodiments herein can be added, exchanged, and/or eliminated so as to provide a number of additional embodiments of the present disclosure.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C). Additionally, the phrase "at least one of A and B" means one or more of (A) or one or more of (B), or one or more of (A) and one or more of (B) such that both one or more of (A) and one or more of (B) is not required.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
a memory array comprising a plurality of strings of memory cells, wherein each string of the plurality of strings comprises:
a first group of memory cells coupled to a first group of access lines and corresponding to a first erase block; and
a second group of memory cells coupled to a second group of access lines and corresponding to a second erase block; and
a controller configured to:
apply a first read pass voltage to unselected access lines of the first group of access lines in association with performing a sensing operation on a selected access line of the first group of access lines; and
determine a second read pass voltage to be applied to the second group of access lines in association with performing the sensing operation on the selected access line of the first group;
wherein the second read pass voltage is determined by:
determining an amount of time that the second group of memory cells has been in a programmed state.

2. The apparatus of claim 1, wherein the sensing operation is a read operation or a program verify operation.

3. The apparatus of claim 1, wherein the second read pass voltage is determined by, in addition to determining the amount of time that the second group of memory cells has been in a programmed state, determining:
a program/erase cycle count corresponding to the second group of memory cells; or
a temperature corresponding to the second group of memory cells; or
both.

4. The apparatus of claim 1, wherein the amount of time that the second group of memory cells has been in the programmed state is measured from a power-on time of the apparatus.

5. The apparatus of claim 1, wherein the controller is further configured to determine the second read pass voltage by performing a scan to determine a threshold voltage (Vt) characteristic corresponding to the second group of memory cells, wherein the Vt characteristic is a Vt tail location corresponding to the second group of memory cells or a Vt valley location corresponding to the second group of memory cells, and wherein the controller is configured to periodically perform the scan.

6. The apparatus of claim 1, wherein the controller is configured to reduce, from a previous value, the second read pass voltage to be applied to the second group of access lines in association with performing the sensing operation on the selected access line of the first group in response to a determined increase in the determined amount of time that the second group of memory cells has been in the programmed state.

7. The apparatus of claim 1, wherein the controller is further configured to determine the second read pass voltage by performing a scan to determine a threshold voltage (Vt) characteristic corresponding to the second group of memory cells, wherein the controller is configured to reduce, from a previous value, the second read pass voltage to be applied to the second group of access lines in association with performing the sensing operation on the selected access line of the first group in response to a determined decrease in a Vt tail corresponding to the second group of memory cells as determined by the scan.

8. The apparatus of claim 1, wherein the controller is further configured to determine the second read pass voltage by performing a scan to determine a threshold voltage (Vt) characteristic corresponding to the second group of memory cells, wherein the Vt characteristic is a Vt tail location corresponding to the second group of memory cells or a Vt valley location corresponding to the second group of memory cells, and wherein the controller is configured to perform the scan as part of the sensing operation.

9. The apparatus of claim 1, wherein each string of the plurality of strings further comprises a third group of access lines located between the first group of access lines and the second group of access lines.

10. The apparatus of claim 9, wherein the third group of access lines are dummy access lines that are coupled to memory cells that are not used to store user data.

11. The apparatus of claim 1, wherein the controller is configured to determine the second read pass voltage to be a same value as the first read pass voltage responsive to determining that the amount of time that the second group of memory cells has been in the programmed state is the same as an amount of time that the first group of memory cells has been in the programmed state.

12. A method, comprising:

applying a first read pass voltage to unselected access lines of a first group of access lines in association with performing a sensing operation on a selected access line of the first group of access lines; and determining a second read pass voltage to be applied to a second group of access lines in association with performing the sensing operation on the selected access line of the first group of access lines; wherein determining the second read pass voltage includes:

determining an amount of time that a group of memory cells coupled to an access line of the second group of access lines has been in a programmed state; and wherein the first group of access lines and the second group of access lines correspond to a memory array comprising a plurality of strings of memory cells, wherein each string of the plurality of strings comprises:

a first group of memory cells coupled to the first group of access lines and corresponding to a first erase block; and a second group of memory cells coupled to a second group of access lines and corresponding to a second erase block.

13. The method of claim 12, wherein performing the sensing operation on the selected access line of the first group of access lines comprises performing a program verify operation on the selected access line of the first group of access lines.

14. The method of claim 12, wherein performing the sensing operation on the selected access line of the first group of access lines comprises performing a read operation on the selected access line of the first group of access lines.

15. The method of claim 12, wherein determining the amount of time that the group of memory cells coupled to the access line of the second group of access lines has been in a programmed state comprises determining a time since power-on of an apparatus comprising the memory array.

16. The method of claim 12, further comprising adjusting, from a previous value, the second read pass voltage to be applied to the second group of access lines in association with performing the sensing operation on the selected access line of the first group based on a determined increase in the determined amount of time that the second group of memory cells has been in the programmed state.

17. The method of claim 12, wherein determining the second read pass voltage further includes performing a scan to determine a threshold voltage (Vt) characteristic corresponding to the group of memory cells coupled to the access line of the second group of access lines; wherein the Vt characteristic is a Vt tail location, and wherein the method further comprises periodically performing the scan to determine the Vt tail corresponding to the group of memory cells coupled to the access line of the second group of access lines.

18. An apparatus, comprising:

a memory array comprising a plurality of strings of memory cells, wherein each string of the plurality of strings comprises:

a first group of memory cells coupled to a first group of access lines and corresponding to a first erase block; and a second group of memory cells coupled to a second group of access lines and corresponding to a second erase block; and a controller configured to:

apply a first read pass voltage to unselected access lines of the first group of access lines in association with performing a sensing operation on a selected access line of the first group of access lines; and apply a variable read pass voltage to the second group of access lines in association with performing the sensing operation on the selected access line of the first group;

wherein a value of the variable read pass voltage is determined based on a determined threshold voltage (Vt) value corresponding to:

a Vt tail corresponding to the second group of memory cells.

19. The apparatus of claim 18, wherein the controller is configured to determine the Vt value during the sensing operation.

20. The apparatus of claim 18, wherein:

the plurality of strings is a first plurality of strings, and wherein the memory array comprises a second plurality of strings, wherein each string of the second plurality of strings comprises:

a third group of memory cells coupled to a third group of access lines and corresponding to a third erase block; and a fourth group of memory cells coupled to a fourth group of access lines and corresponding to a fourth erase block.

\* \* \* \* \*